United States Patent
Hamada et al.

(10) Patent No.: US 9,634,254 B2
(45) Date of Patent: Apr. 25, 2017

(54) ORGANIC MATERIAL AND ORGANIC LIGHT EMITTING DIODE DISPLAY USING SAME

(75) Inventors: Yuji Hamada, Yongin (KR); Kwan-Hee Lee, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 406 days.

(21) Appl. No.: 13/097,886

(22) Filed: Apr. 29, 2011

(65) Prior Publication Data

US 2011/0285274 A1    Nov. 24, 2011

(30) Foreign Application Priority Data

May 18, 2010  (KR) .......................... 10-2010-0046507

(51) Int. Cl.
| | | |
|---|---|---|
| H01J 1/63 | (2006.01) | |
| C09K 11/06 | (2006.01) | |
| C07D 333/20 | (2006.01) | |
| C07D 271/10 | (2006.01) | |
| C07C 13/47 | (2006.01) | |
| C07C 13/465 | (2006.01) | |
| H01L 51/00 | (2006.01) | |
| H01L 51/42 | (2006.01) | |
| H01L 51/50 | (2006.01) | |

(52) U.S. Cl.
CPC ...... *H01L 51/0058* (2013.01); *H01L 51/0055* (2013.01); *H01L 51/0056* (2013.01); *H01L 51/0077* (2013.01); *H01L 51/4273* (2013.01); *H01L 51/5012* (2013.01); *H01L 2251/308* (2013.01)

(58) Field of Classification Search
None
See application file for complete search history.

(56) References Cited

U.S. PATENT DOCUMENTS

| | | | |
|---|---|---|---|
| 5,077,142 A | 12/1991 | Sakon et al. | |
| 6,534,199 B1 | 3/2003 | Hosokawa et al. | |
| 6,951,693 B2 | 10/2005 | Hosokawa et al. | |
| 2006/0115678 A1 | 6/2006 | Saitoh et al. | |
| 2008/0299294 A1 | 12/2008 | Yen | |
| 2011/0037057 A1* | 2/2011 | LeCloux et al. | ................ 257/40 |

FOREIGN PATENT DOCUMENTS

| | | |
|---|---|---|
| EP | 2031037 A1 | 3/2009 |
| JP | 4041816 B2 | 11/2007 |
| JP | 2009-267370 A | 11/2009 |
| JP | 5026380 B2 | 9/2012 |
| KR | 1020080049213 A | 6/2008 |
| KR | 1020080063093 A | 7/2008 |

(Continued)

OTHER PUBLICATIONS

Machine English translation of Je et al. (KR 10-2009-0086015 A). Jun. 8, 2015.*

(Continued)

*Primary Examiner* — J. L. Yang
(74) *Attorney, Agent, or Firm* — Knobbe Martens Olson & Bear LLP

(57) ABSTRACT

An organic material for an organic light emitting diode (OLED) display, and an OLED display are provided, and the organic material includes an anthracene derivative includes at least deuterium.

15 Claims, 2 Drawing Sheets

(56) References Cited

FOREIGN PATENT DOCUMENTS

| KR | 1020080095749 A | 10/2008 | | |
|---|---|---|---|---|
| KR | 1020090086015 A | 8/2009 | | |
| KR | 1020100069216 A | 6/2010 | | |
| TW | 1278248 B | 4/2007 | | |
| TW | I278248 B | 4/2007 | | |
| WO | WO2004/018578 A1 | 3/2004 | | |
| WO | WO 2005/000787 A1 | 1/2005 | | |
| WO | WO 2010/052885 A1 | 5/2010 | | |
| WO | WO -2010/071362 A2 * | 6/2010 | ............ | C09K 11/06 |
| WO | WO 2010071362 A2 | 6/2010 | | |
| WO | WO 2010/099534 A2 | 9/2010 | | |

OTHER PUBLICATIONS

Office Action in corresponding European Patent Application No. 11166396.9 dated Aug. 22, 2012, 5 pages.

\* cited by examiner

ORGANIC MATERIAL AND ORGANIC LIGHT EMITTING DIODE DISPLAY USING SAME

CROSS-REFERENCE TO RELATED APPLICATIONS

This application claims priority to and the benefit of Korean Patent Application No. 10-2010-0046507 filed in the Korean Intellectual Property Office on May 18, 2010, the entire contents of which are incorporated herein by reference.

BACKGROUND

Field

The present embodiments relate to an organic material for an organic light emitting diode (OLED) display, and an OLED display using the same.

Description of the Related Technology

An OLED display includes two electrodes facing each other and an organic layer interposed between the two electrodes. In the OLED display, holes injected from one electrode and electrons injected from the other electrode are combined in the organic layer to form excitons, and as the excitons generate energy, light is emitted. The OLED display may be applicable to various fields including a display device and an illumination system.

The OLED display may be driven by using self-emission characteristics of an organic light emission layer, so it does not necessarily require an auxiliary light source. Thus, less power is consumed for driving the OLED display. In addition, because the OLED display has a wide viewing angle and a fast response speed, it is receiving much attention as a next-generation display device.

The OLED display includes several organic layers including an organic light emission layer. However, an organic material of the organic layer is generally weak to heat, so it is easily degraded according to a change in temperature.

The above information disclosed in this Background section is only for enhancement of understanding of the background of the embodiments and therefore it may contain information that does not form the prior art that is already known in this country to a person of ordinary skill in the art.

SUMMARY OF CERTAIN INVENTIVE ASPECTS

The present embodiments provide an organic material having improved heat resistance.

The present embodiments also provide an organic light emitting diode (OLED) display including the organic material.

An exemplary embodiment provides an organic material for an organic light emitting diode (OLED) display including an anthracene derivative of which at least one constituent is substituted with deuterium.

Another embodiment provides an OLED display including first and second electrodes, and an organic layer interposed between the first and second electrodes. The organic layer may include an anthracene derivative of which at least one constituent is substituted with deuterium.

The anthracene derivative may be represented by Formula 1.

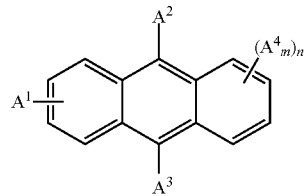

[Formula 1]

wherein, $A^1$ to $A^4$ may be independently selected from the group consisting of hydrogen, a $C_1$-$C_6$ alkyl group, a $C_1$-$C_6$ alkoxy group, a $C_6$-$C_{18}$ aryloxy group, a $C_6$-$C_{20}$ aryl group, a $C_3$ to $C_{20}$ heteroaryl group, an amino group, an alkylamino group, an arylamino group, a cyano group, a nitro group, a hydroxyl group, and a halogen atom, m may be an integer of 1 to 4, n may be an integer of 0 to 4, and at least one of $A^1$ to $A^4$ may be deuterium or a substituent including deuterium.

The organic layer may be an organic light emission layer.
The organic material may further include a dopant material.
The dopant material may include a substituted or unsubstituted styrene, a substituted or unsubstituted perylene, a substituted or unsubstituted pyrene, a substituted or unsubstituted arylethylbenzene, a substituted or unsubstituted paraphenylene, a substituted or unsubstituted thiophene, a chelate metal complex, or combinations thereof.

The dopant material may include a compound of which a constituent is substituted with deuterium.

The dopant material may include an anthracene derivative of which at least one constituent is substituted with deuterium.

An organic material having improved heat resistance may be provided. An OLED display having improved reliability and a lengthened life span by the organic material may be implemented.

BRIEF DESCRIPTION OF THE DRAWINGS

FIG. 3 is a graph showing a change in luminance of the OLED displays according to Examples 1 to 3 and the comparative example over time.

DETAILED DESCRIPTION OF CERTAIN INVENTIVE EMBODIMENTS

Figure 1:
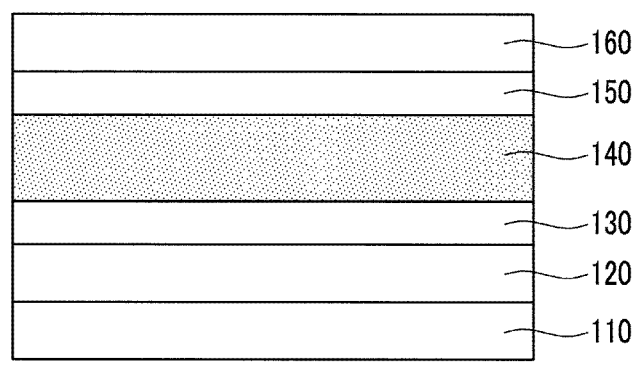
FIG. 1 is a view for explaining an organic light emitting diode (OLED) display according to an exemplary embodiment.

An organic material and an organic light emitting diode (OLED) display using the same according to exemplary embodiments will now be described. The exemplary embodiments described herein are provided to allow a skilled person in the art to easily understand the idea of the present invention, and the present invention is not meant to be limited thereto. The exemplary embodiments described herein may be modified within the technical idea and scope of the present invention.

In the present exemplary embodiment, unless otherwise specified, "substituted" refers to a hydrogen atom of a compound substituted with a substituent selected from among halogen atoms (F, Br, Cl, or I), a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group or its salt, a sulfonic acid group or its salt, a phosphoric acid or its salt, an alkyl group, a $C_2$-$C_{16}$ alkenyl group, a $C_2$-$C_{16}$ alkynyl group, an aryl group, a $C_7$-$C_{13}$ arylakyl group, a $C_1$-$C_4$ oxyalkyl group, a $C_1$-$C_{20}$ heteroalkyl group, a $C_3$-$C_{20}$ heteroaryl alkyl group, a cycloalkyl group, a $C_3$-$C_{15}$ cycloalkenyl group, a $C_6$-$C_{15}$ cycloalkynyl group, a heterocycloalkyl group, and combinations thereof.

Also, unless otherwise specified, "hetero" refers to containing one to three hetero atoms selected from among N, O, S, or P.

In the present exemplary embodiment, "and/or" is used to include at least one among constituent elements arranged before and after. In the present exemplary embodiment, each element and/or parts are designated by using expressions such as "first", "second", etc., but these are used for clarification and the present invention is not limited thereto.

In the present exemplary embodiment, it will be understood that when an element is referred to as being "on" another element, it can be directly on the other element or intervening elements may also be present.

In the drawings, the thickness and/or relative thickness of the elements may be exaggerated in order to clarify embodiments. Also, the expressions related to positions such as "upper part", "lower part", or the like are relatively used for clarification, without limiting absolute positions among the elements.

An organic material for an OLED display according to an exemplary embodiment will now be described.

The organic material may be used to form an organic light emission layer or an auxiliary layer within the OLED display. Here, the auxiliary layer may be one of a hole injection layer, a hole transport layer, an electron injection layer, and an electron transport layer.

The organic material may include an anthracene derivative of which at least one constituent is substituted with deuterium.

The anthracene derivative may be represented by Formula 1.

[Formula 1]

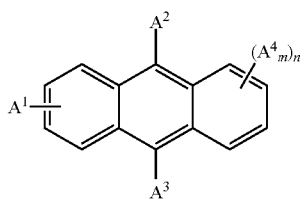

wherein, $A^1$ to $A^4$ are independently selected from the group consisting of hydrogen, a $C_1$-$C_6$ alkyl group, a $C_1$-$C_6$ alkoxy group, a $C_6$-$C_{18}$ aryloxy group, a $C_6$-$C_{20}$ aryl group, a $C_3$-$C_{20}$ heteroaryl group, an amino group, an alkylamino group, an arylamino group, a cyano group, a nitro group, a hydroxyl group, and a halogen atom, m is an integer of 1 to 4, n is an integer of 0 to 4, and at least one of $A^1$ to $A^4$ is deuterium or a substituent including deuterium.

The $C_1$-$C_6$ alkyl group includes a methyl group, an ethyl group, an n-propyl group, an i-propyl group, an n-butyl group, an i-butyl group, a sec-butyl group, a t-butyl group, an i-pentyl group, a t-pentyl group, a neopentyl group, an n-hexyl group, and an i-hexyl group.

The $C_1$-$C_6$ alkoxy group includes a methoxy group, an ethoxy group, an n-propoxy group, an i-propoxy group, an n-butyloxy group, an i-butyloxy group, a sec-butyloxy group, an i-pentyloxy group, a t-pentyloxy group, and an n-hexyloxy group.

The $C_6$-$C_{18}$ aryloxy group includes a phenoxy group and a naphthyloxy group.

The $C_6$-$C_{20}$ aryl group includes a phenyl group and a naphthyl group.

The alkylamino group includes NHR and $NR_2$. The alkyl group (R) of the alkylamino group may be selected from a $C_1$-$C_6$ alkyl group.

The arylamino group includes —NHAr and $NAr_2$. The aryl group (Ar) of the arylamino group may be selected from a $C_6$-$C_{20}$ aryl group.

The halogen atom includes fluorine, chlorine, bromine, and iodine.

For example, the anthracene derivative may include a compound represented by one of Formula 2 to Formula 14.

[Formula 2]

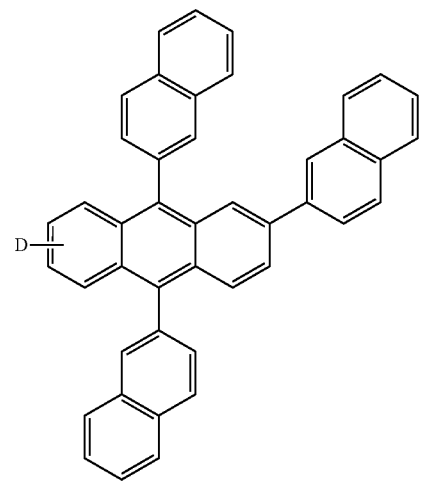

[Formula 3]

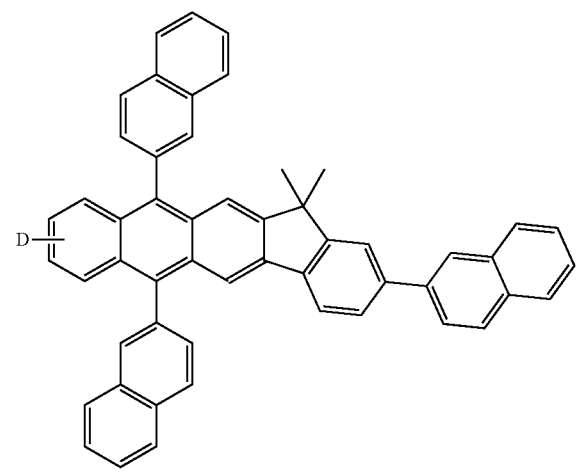

[Formula 4]
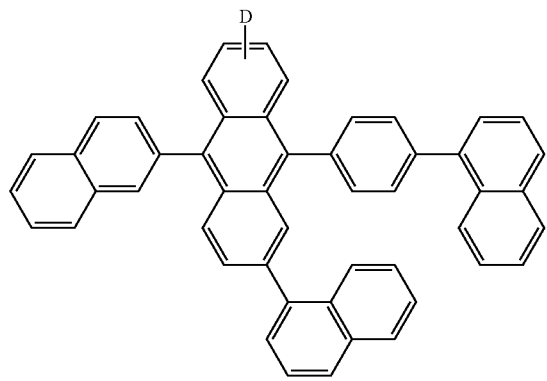
[Formula 5]
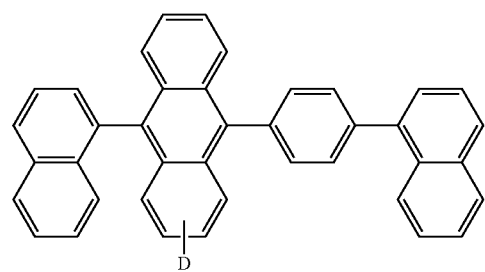
[Formula 6]
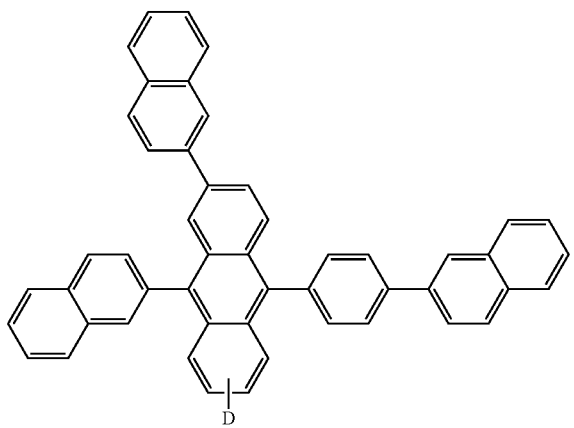
[Formula 7]
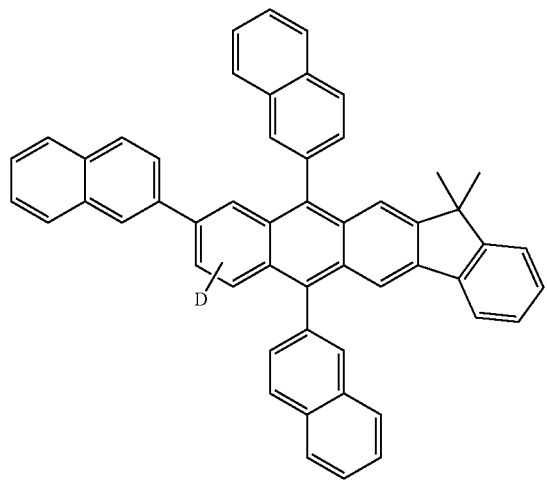
[Formula 8]
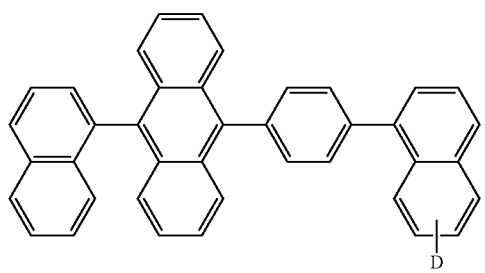
[Formula 9]
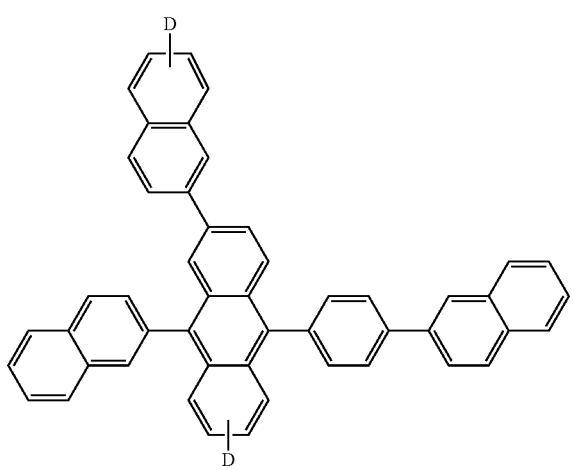
[Formula 10]
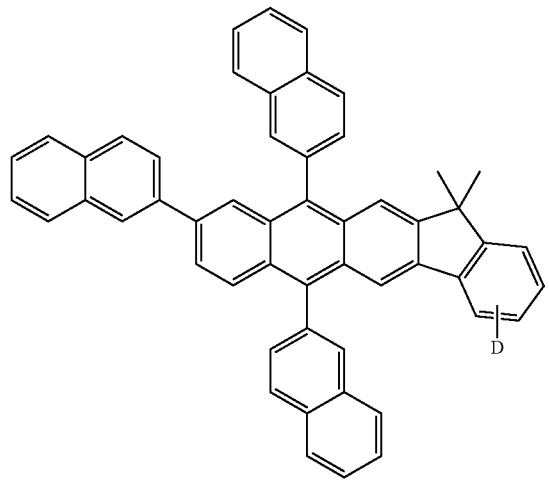
[Formula 11]
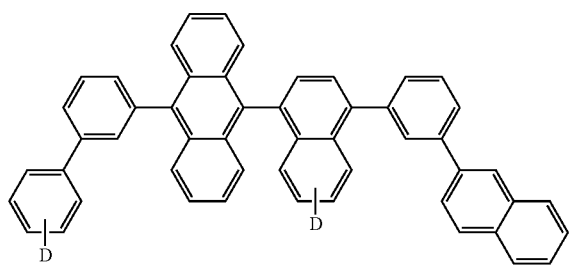

-continued

[Formula 12]

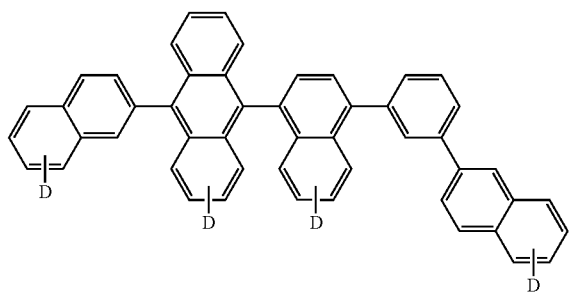

[Formula 13]

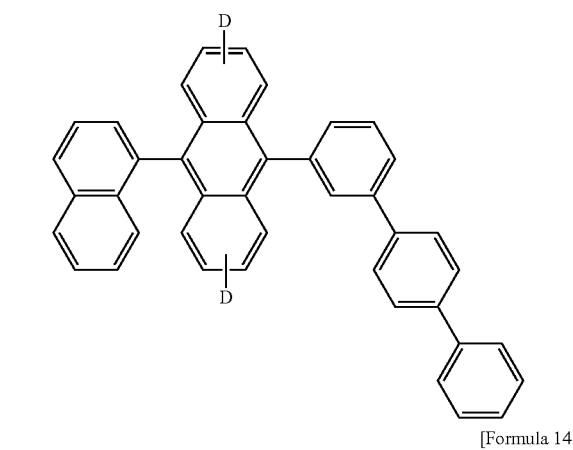

[Formula 14]

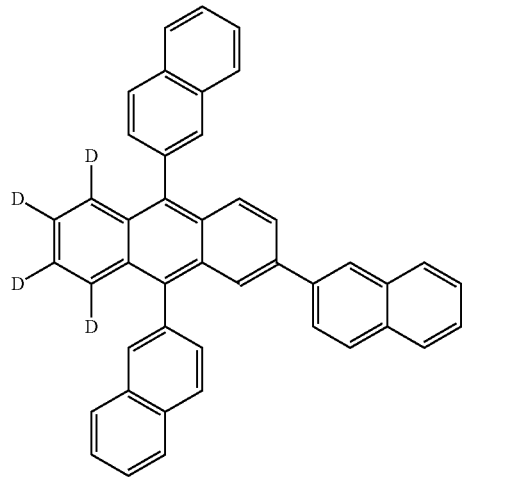

In Formula 2 to Formula 14, D is deuterium.

In Formula 2 to Formula 14, the deuterium may be included on an anthracenyl group and/or on other functional groups. For example, in Formula 2, at least one hydrogen of the anthracenyl group and/or naphthyl group may be substituted with a deuterium atom. In an exemplary embodiment, a plurality of hydrogen atoms of the organic compound may be substituted with deuterium atoms.

Because the organic compound according to one embodiment includes deuterium, it may have a relatively high molecular weight. Accordingly, the glass transition temperature, the melting point, or the like, that are affected by the molecular weight, may be increased. Thus, heat resistance of the organic material including the organic compound may be improved.

The organic material may include a dopant material. For example, when the organic material is used as a material of an organic light emission layer, the dopant material may include substituted or unsubstituted styrene, a substituted or unsubstituted perylene, a substituted or unsubstituted pyrene, a substituted or unsubstituted arylethylbenzene, a substituted or unsubstituted paraphenylene, a substituted or unsubstituted thiophene, a chelate metal complex, or combinations thereof.

For example, the dopant material may include at least one selected from among compounds represented by Formula 15 to Formula 23.

[Formula 15]

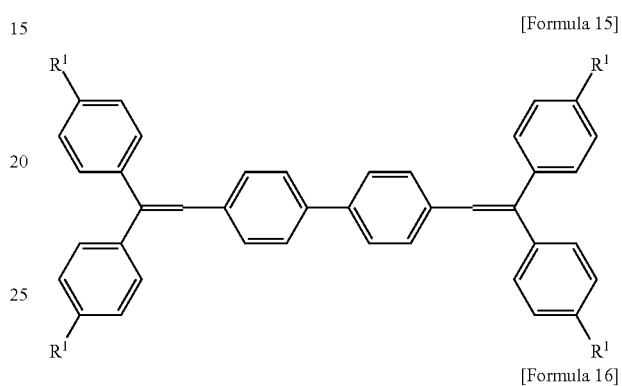

[Formula 16]

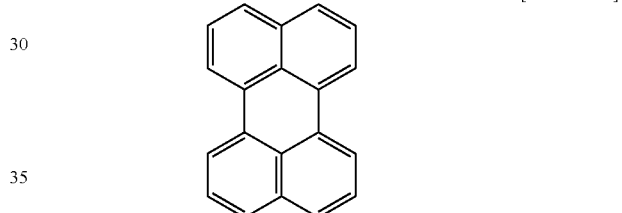

[Formula 17]

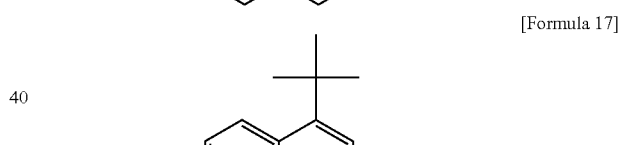

[Formula 18]

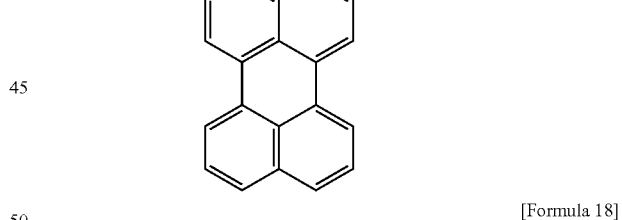

[Formula 19]

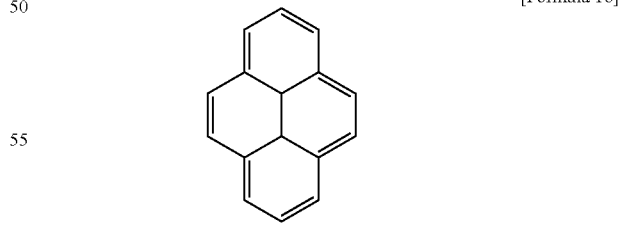

-continued

[Formula 20]

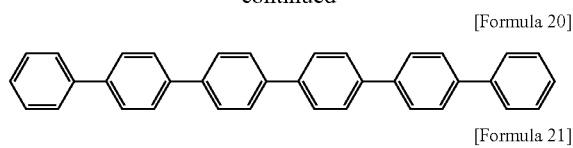

[Formula 21]

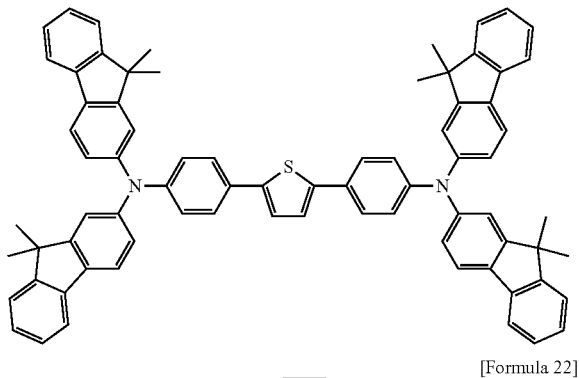

[Formula 22]

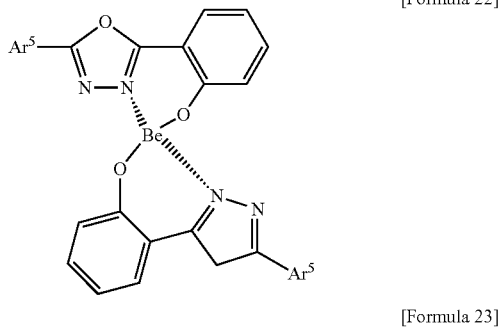

[Formula 23]

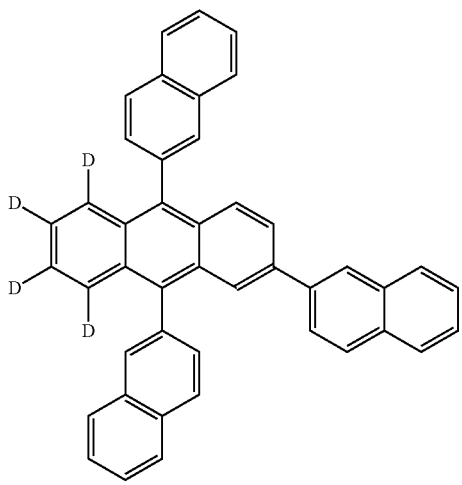

In Formula 15, $R^1$ may be selected from the group consisting of a hydrogen atom, a methyl group, and a t-butyl group. In Formula 19, $Ar^4$ may be selected from a $C_6$-$C_{20}$ aryl group. In Formula 22, $Ar^5$ may be selected from a $C_6$-$C_{14}$ aryl group.

In an exemplary embodiment, at least one of hydrogen atoms of the compound constituting the dopant material may be substituted with deuterium. For example, the dopant material may include a compound represented by Formula 24 shown below.

[Formula 24]

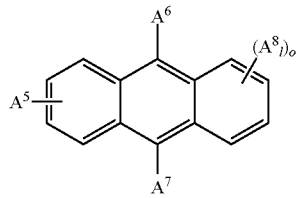

In Formula 24, $A^5$ to $A^8$ are independently selected from the group consisting of hydrogen, a $C_1$-$C_6$ alkyl group, a $C_1$-$C_6$ alkoxy group, a $C_6$-$C_{18}$ aryloxy group, a $C_6$-$C_{20}$ aryl group, an amino group, an alkylamino group, an arylamino group, a cyano group, a nitro group, a hydroxyl group, and a halogen atom, 1 is an integer of 0 to 4, c is an integer of 0 to 4, and at least one of $A^5$ to $A^8$ is deuterium or a substituent including deuterium. The compound represented by Formula 24 may be a compound having different substituents from those of the compound represented by Formula 1 above.

The $C_1$-$C_6$ alkyl group includes a methyl group, an ethyl group, an n-propyl group, an i-propyl group, an n-butyl group, an i-butyl group, a sec-butyl group, a t-butyl group, an i-pentyl group, a t-pentyl group, a neopentyl group, an n-hexyl group, and an i-hexyl group.

The $C_1$-$C_6$ alkoxy group includes a methoxy group, an ethoxy group, an n-propoxy group, an i-propoxy group, an n-butyloxy group, an i-butyloxy group, a sec-butyloxy group, an i-pentyloxy group, a t-pentyloxy group, and an n-hexyloxy group.

The $C_6$-$C_{18}$ aryloxy group includes a phenoxy group and a naphthyloxy group.

The $C_6$-$C_{20}$ aryl group includes a phenyl group and a naphthyl group.

The alkylamino group includes NHR and $NR_2$. The alkyl group (R) of the alkylamino group may be selected from a $C_1$-$C_6$ alkyl group.

The arylamino group includes —NHAr and $NAr_2$. The aryl group (Ar) of the arylamino group may be selected from a $C_6$-$C_{20}$ aryl group.

The halogen atom includes fluorine, chlorine, bromine, and iodine.

When the dopant material includes a compound including deuterium, the heat resistance of the organic material may be further improved.

An OLED display including the foregoing organic material will now be described with reference to FIG. 1.

FIG. 1 is a cross-sectional view of an OLED display according to an exemplary embodiment.

With reference to FIG. 1, a lower electrode 120 and an upper electrode 160 are disposed on a substrate 110, and an organic light emission layer 140 is disposed between the lower electrode 120 and the upper electrode 160. A lower auxiliary layer 130 may be interposed between the lower electrode 120 and the organic light emission layer 140. An upper auxiliary layer 150 may be interposed between the organic light emission layer 140 and the upper electrode 160.

The substrate 110 may made of glass, polymer, or a combination thereof.

One of the lower electrode 120 and the upper electrode 160 may be an anode and the other may be a cathode. The lower electrode 120 and the upper electrode 160 may be transparent or opaque electrodes. For example, the lower electrode 120 and the upper electrode 160 may be made of ITO, IZO, or a combination thereof, or may be made of aluminum (Al), silver (Ag), or a combination thereof.

One of the lower auxiliary layer 130 and the upper auxiliary layer 150 may include a hole injection layer and/or a hole transport layer, and the other may include an electron transport layer and/or an electron injection layer. For example, when the lower electrode 120 is an anode and the upper electrode 150 is a cathode, the lower auxiliary layer 130 may include a hole injection layer and/or a hole transport layer and the upper auxiliary layer 150 may include an electron injection layer and/or an electron transport layer. In this case, at least one of the lower auxiliary layer 130 and the upper auxiliary layer 150 may be omitted.

The organic material according to an exemplary embodiment may be included in the lower auxiliary layer 130, the organic light emission layer 140, the upper auxiliary layer 150, or any combination thereof. For example, the organic material may be included in the organic light emission layer 140. Here, the organic material may include a host material and a dopant material mixed in the host material.

Hereinafter, the case in which the organic material is included in a blue host material will be described, but the present invention is not meant to be limited thereto.

The blue host material includes an anthracene derivative including at least one deuterium. In the anthracene derivative, at least one of hydrogen atoms of an anthracenyl group may be substituted by a deuterium atom or at least one of hydrogen atoms of a functional group other than the anthracenyl group may be substituted by a deuterium atom. Alternatively, in the anthracene derivative, a hydrogen atom of the anthracenyl group and a hydrogen atom of a substituent other than the anthracenyl group may be simultaneously substituted with deuterium atoms.

For example, the blue host material may include a compound represented by Formula 1.

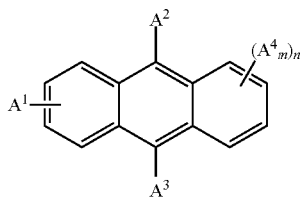

[Formula 1]

In Formula 1, $A^1$ to $A^4$ are independently selected from the group consisting of hydrogen, a $C_1$-$C_6$ alkyl group, a $C_1$-$C_6$ alkoxy group, a $C_6$-$C_{18}$ aryloxy group, a $C_6$-$C_{20}$ aryl group, a $C_3$-$C_{20}$ heteroaryl group, an amino group, an alkylamino group, an arylamino group, a cyano group, a nitro group, a hydroxyl group, and a halogen atom, m is an integer of 1 to 4, n is an integer of 0 to 4, and at least one of $A^1$ to $A^4$ is deuterium or a substituent including deuterium.

The $C_1$-$C_6$ alkyl group includes a methyl group, an ethyl group, an n-propyl group, an i-propyl group, an n-butyl group, an i-butyl group, a sec-butyl group, a t-butyl group, an i-pentyl group, a t-pentyl group, a neopentyl group, an n-hexyl group, and an i-hexyl group.

The $C_1$-$C_6$ alkoxy group includes a methoxy group, an ethoxy group, an n-propoxy group, an i-propoxy group, an n-butyloxy group, an i-butyloxy group, a sec-butyloxy group, an i-pentyloxy group, a t-pentyloxy group, and an n-hexyloxy group.

The $C_6$-$C_{18}$ aryloxy group includes a phenoxy group and a naphthyloxy group.

The $C_6$-$C_{20}$ aryl group includes a phenyl group and a naphthyl group.

The $C_6$-$C_{20}$ aryl group includes a phenyl group and a naphthyl group. The alkyl group (R) of the alkylamino group may be selected from a $C_1$-$C_6$ alkyl group.

The arylamino group includes —NHAr and NAr$_2$. The aryl group (Ar) of the arylamino group may be selected from a $C_6$-$C_{20}$ aryl group.

The halogen atom includes fluorine, chlorine, bromine, and iodine.

For example, the blue host material may include at least one selected from among compounds represented by Formula 2 to Formula 14.

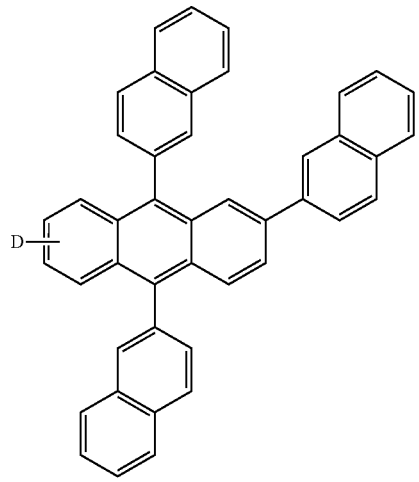

[Formula 2]

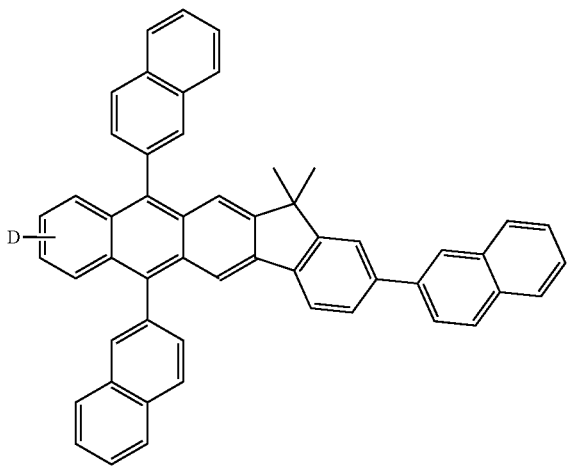

[Formula 3]

[Formula 4]
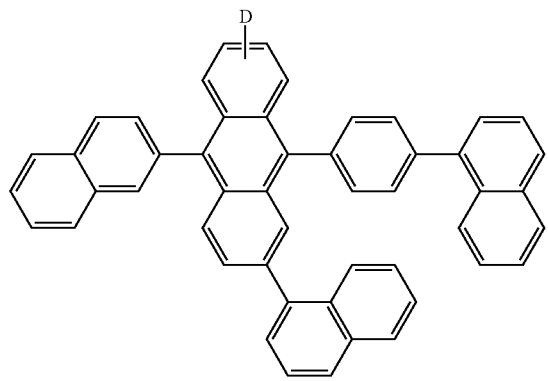
[Formula 5]
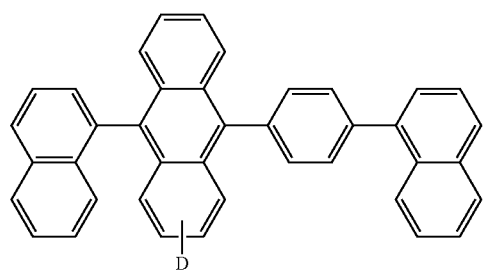
[Formula 6]
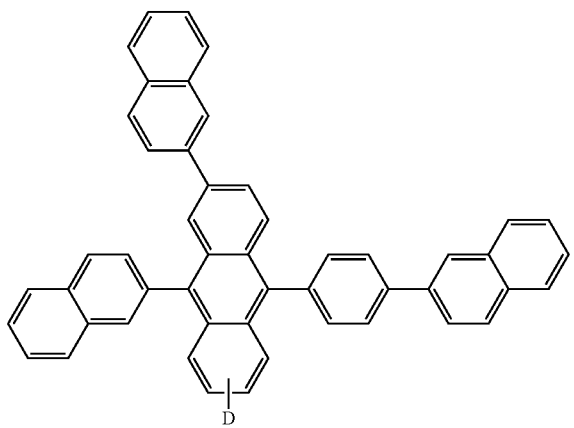
[Formula 7]
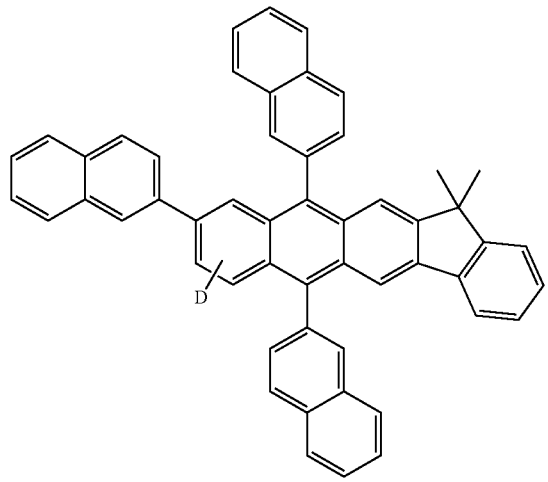
[Formula 8]
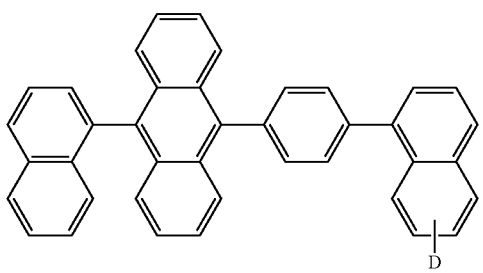
[Formula 9]
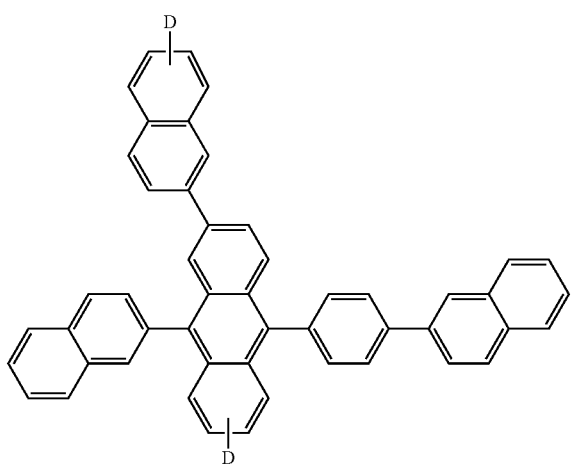
[Formula 10]
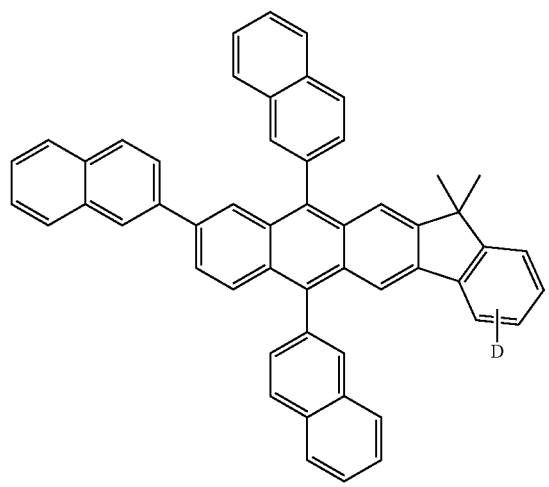
[Formula 11]
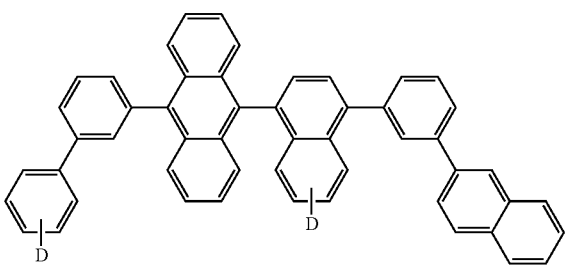

[Formula 12]

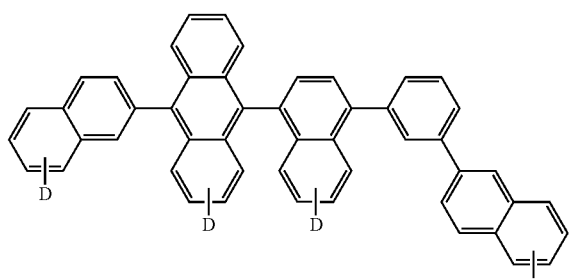

[Formula 13]

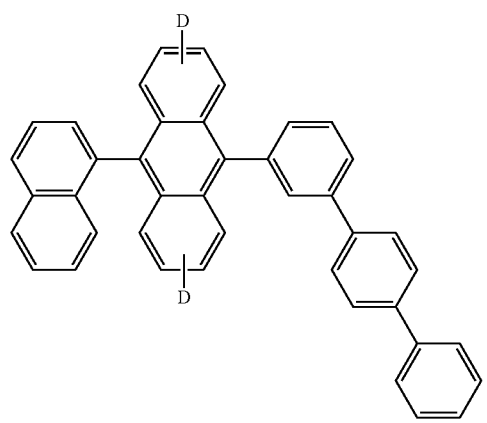

[Formula 14]

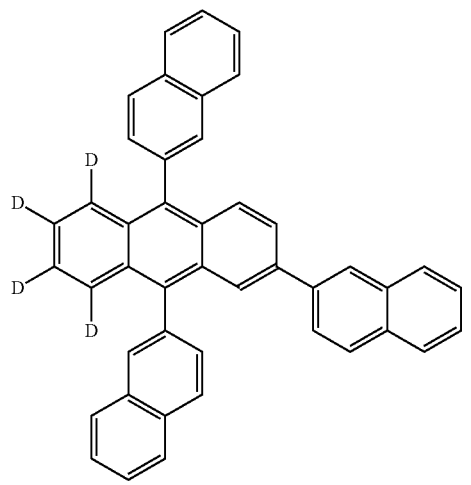

In Formula 2 to Formula 14, D is deuterium.

The molecular weight of the compound is increased by the deuterium. The increase in the molecular weight of the compound may lead to an increase in a melting point and/or glass transition temperature of the organic material including the blue host material. Accordingly, heat resistance of the organic light emission layer 140 including the blue host material may be improved. Thus, the reliability of the OLED display including the blue host material may be improved and a life span of the OLED display may be lengthened.

The organic light emission layer 140 may selectively further include hosts of different colors. For example, the organic light emission layer 140 may further include red hosts and/or green hosts therein.

The organic emission layer 140 may include a dopant material. The dopant material may be, for example, a substituted or unsubstituted styrene, a substituted or unsubstituted perylene, a substituted or unsubstituted pyrene, a substituted or unsubstituted arylethylbenzene, a substituted or unsubstituted paraphenylene, a substituted or unsubstituted thiophene, a chelate metal complex, or combinations thereof.

For example, the dopant material may include at least one selected from among compounds represented by Formula 15 to Formula 23.

[Formula 15]

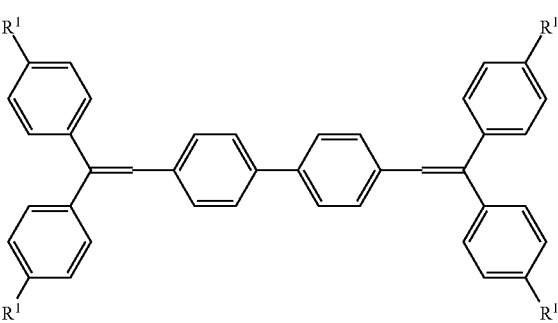

[Formula 16]

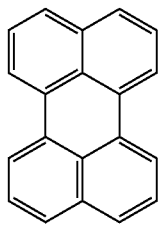

[Formula 17]

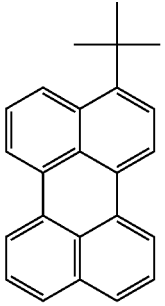

[Formula 18]

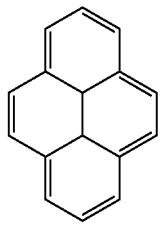

[Formula 19]

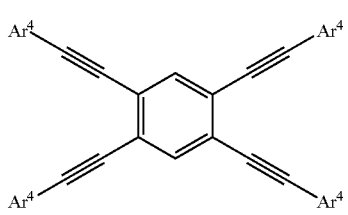

[Formula 20]

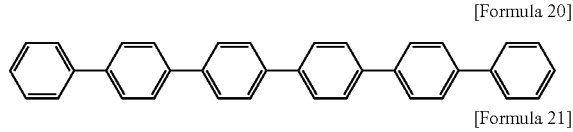

[Formula 21]

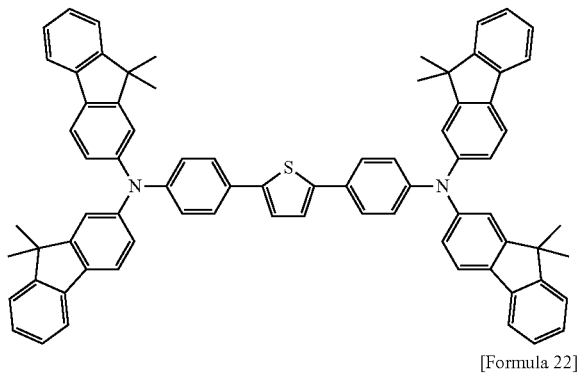

[Formula 22]

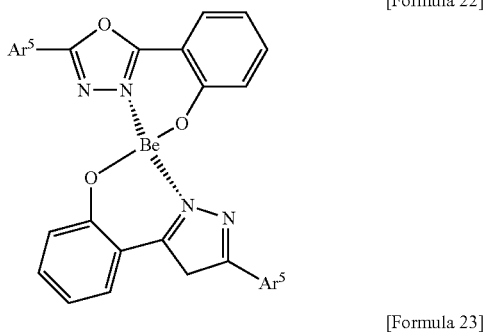

[Formula 23]

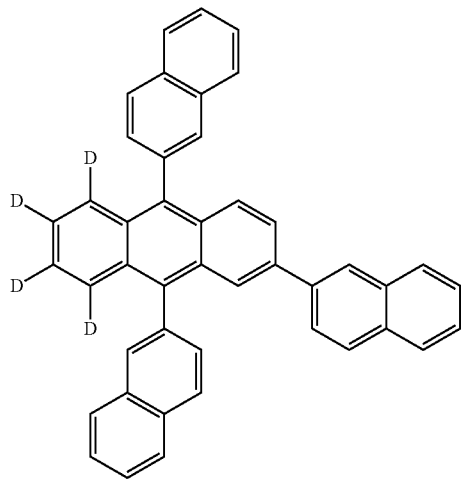

In Formula 15, each $R^1$ may be independently selected from the group consisting of hydrogen, a methyl group, and a t-butyl group. In Formula 19, $Ar^4$ is selected from a $C_6$-$C_{20}$ aryl group. For example, in Formula 19, $Ar^4$ is selected from a $C_6$-$C_{14}$ aryl group.

In an exemplary embodiment, the dopant material may include a compound of which a constituent has been substituted with deuterium. For example, the dopant material may be selected from compounds represented by Formula 15 to Formula 23, and the selected compound may be substituted with deuterium. For another example, the dopant material may include a compound represented by Formula 24 shown below.

[Formula 24]

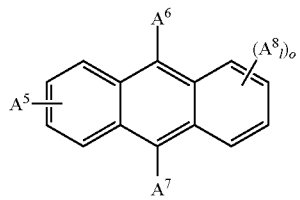

In Formula 24, $A^5$ to $A^8$ are independently selected from the group consisting of hydrogen, a $C_1$-$C_6$ alkyl group, a $C_1$-$C_6$ alkoxy group, a $C_6$-$C_{18}$ aryloxy group, a $C_6$-$C_{20}$ aryl group, an amino group, an alkylamino group, an arylamino group, a cyano group, a nitro group, a hydroxyl group, and a halogen atom, l is an integer of 0 to 4, c is an integer of 0 to 4, and at least one of $A^5$ to $A^8$ is deuterium or a substituent including deuterium. The compound represented by Formula 24 may be a compound that is different from that used as the host material.

The $C_1$-$C_6$ alkyl group includes a methyl group, an ethyl group, an n-propyl group, an i-propyl group, an n-butyl group, an i-butyl group, a sec-butyl group, a t-butyl group, an i-pentyl group, a t-pentyl group, a neopentyl group, an n-hexyl group, and an i-hexyl group.

The $C_1$-$C_6$ alkoxy group includes a methoxy group, an ethoxy group, an n-propoxy group, an i-propoxy group, an n-butyloxy group, an i-butyloxy group, a sec-butyloxy group, an i-pentyloxy group, a t-pentyloxy group, and an n-hexyloxy group.

The $C_6$-$C_{18}$ aryloxy group includes a phenoxy group and a naphthyloxy group.

The $C_6$-$C_{20}$ aryl group includes a phenyl group and a naphthyl group.

The alkylamino group includes NHR and $NR_2$. The alkyl group (R) of the alkylamino group may be selected from a $C_1$-$C_6$ alkyl group.

The arylamino group includes —NHAr and $NAr_2$. The aryl group (Ar) of the arylamino group may be selected from a $C_6$-$C_{20}$ alkyl group.

The halogen atom includes fluorine, chlorine, bromine, and iodine.

When the dopant material includes a compound including deuterium, the heat resistance of the organic material may be further improved.

An OLED display including the organic material according to an exemplary embodiment will now be described with reference to FIG. 2. The same reference numerals are used for the same elements as those described above with reference to FIG. 1, and descriptions thereof will be omitted.

Figure 2:
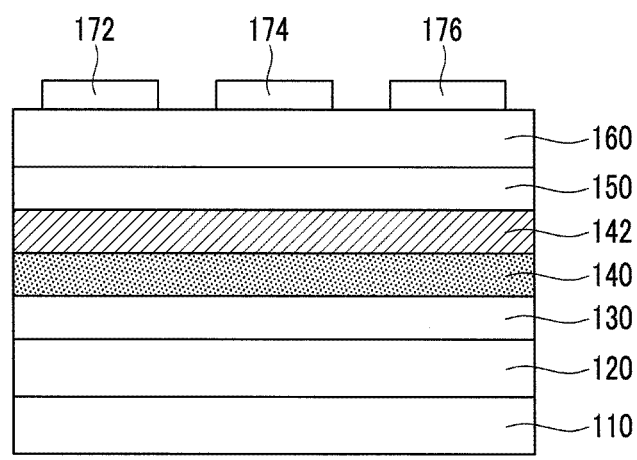
FIG. 2 is a view for explaining an organic light emitting diode (OLED) display according to another exemplary embodiment.

FIG. 2 is a cross-sectional view of an OLED display according to another exemplary embodiment.

With reference to FIG. 2, organic light emission layers 140 and 142 may include a plurality of stacked layers. The layers emit light of different colors, respectively, and the combination of the stacked layers may emit white light. For example, the lower light emission layer 140 may emit blue light, the upper light emission layer 142 may emit light of a different color other than blue color, and the stacked lower and upper light emission layers 140 and 142 may emit white light.

The upper electrode 160 may be disposed on the upper light emission layer 140, and color filters 172, 174, and 176 may be disposed on the upper electrode 160. As the white light emitted through the organic light emission layers 140 and 142 passes through the color filters 172, 174, and 176, it may be converted into red, blue, and green colors. Alternatively, color filters of any other colors may be disposed on the upper electrode 160, and light beams of different colors may be emitted.

The present invention will be described in detail through the following exemplary embodiments. The following exemplary embodiments are merely described for the purpose of explanation, without limiting the scope of the present invention.

Fabrication of OLED Display

Example 1

An ITO electrode was formed on a glass substrate, on which 4,4',4"-tris(3-methylphenyl-amino)triphenylamine (MTDATA), 1,4,5,8,9,12-hexaazatriphenylenehexanitrile (HAT-CN6), and N,N'-diphenyl-N,N'-di(1-naphthyl)-1,1'-biphenyl-4,4'-diamine (NPB) were then deposited to have thicknesses of about 70 nm, 5 nm, and 70 nm respectively.

A mixture obtained by mixing a compound represented by Formula 23 and a compound represented by Formula 16 was deposited on the resultant structure to form an organic light emission layer. The compound represented by Formula 16 was mixed with the concentration of 3 wt % based on the compound represented by Formula 23, and used as a dopant of the organic light emission layer.

Then, a mixture of 2,9-dimethyl-4,7-diphenyl-1,10-phenanthrolline (BCP) and 8-hydroxyquinolinate lithium (LiQ) was deposited on the organic light emission layer. In this case, the BCP and the LiQ were mixed in the ratio of 50 wt %:50 wt %.

Thereafter, magnesium and silver were deposited in the weight ratio of 160:10 to form an upper electrode on the organic light emission layer. As a result, an OLED display was fabricated.

[Formula 23]

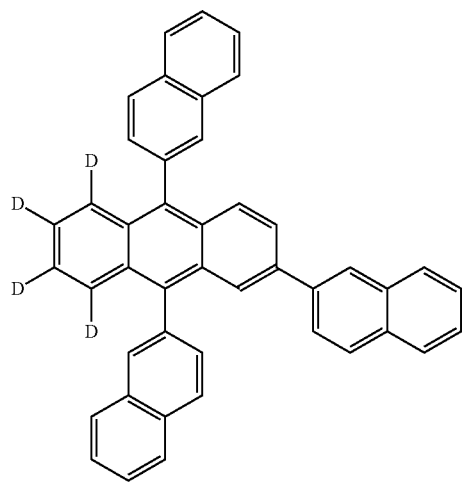

[Formula 16]

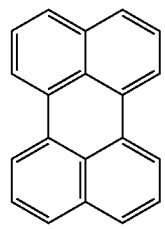

Example 2

An OLED display was fabricated in the same manner as that of the Example 1, except that the compound represented by formula 16 as a dopant was used at the concentration of about 2 wt % based on the compound represented by Formula 23.

Example 3

An OLED display was fabricated in the same manner as that of the Example 1, except that the compound represented by formula 16 as a dopant was used at the concentration of about 1 wt % based on the compound represented by Formula 23.

Comparative Example 1

An OLED display was fabricated in the same manner as those of Example 1, except that the compound represented by Formula 23 was replaced with 2,9,10-tris(2-naphthyl) anthracene.

Evaluation

The luminance of each of the OLED displays fabricated according to the Examples 1 to 3 and Comparative example 1 according to time was measured. The change in the luminance over time was measured by applying a constant current of about 39 mA/cm$^2$ to the respective OLED displays, at room temperature, according to the highly accelerated life test.

Figure 3:
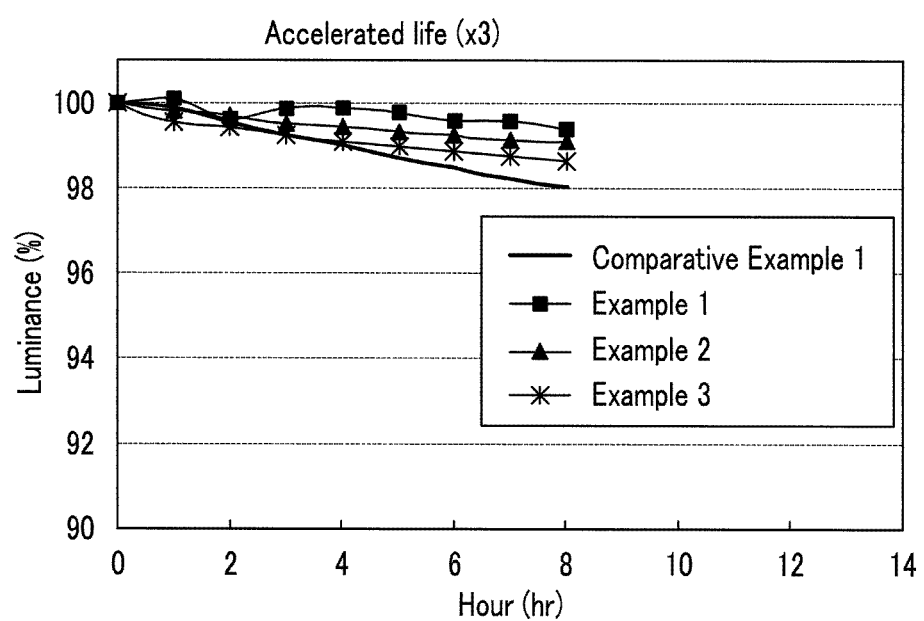
FIG. 3 is a graph for explaining effects of the exemplary embodiments.

A change in the luminance of each of the OLED displays over time was measured at room temperature, and the results are shown in FIG. 3.

With reference to FIG. 3, it is noted that a luminance reduction rate of each of the OLED displays according to Examples 1 to 3 is smaller than that of the OLED display according to Comparative example 1. It is noted that the OLED displays according to Examples 1 to 3 have stable luminance characteristics. Therefore, the OLED displays may be implemented with improved reliability.

While the present embodiments have been described in connection with what is presently considered to be practical exemplary embodiments, it is to be understood that the invention are not limited to the disclosed embodiments. The scope of the present embodiments is intended to cover various modifications and equivalent arrangements included within the spirit and scope of the appended claims.

What is claimed is:
1. A compound selected from compounds represented by Formula 2, Formula 3, Formula 4, Formula 6, Formula 7, Formula 9, Formula 10, or Formula 14:

[Formula 2]
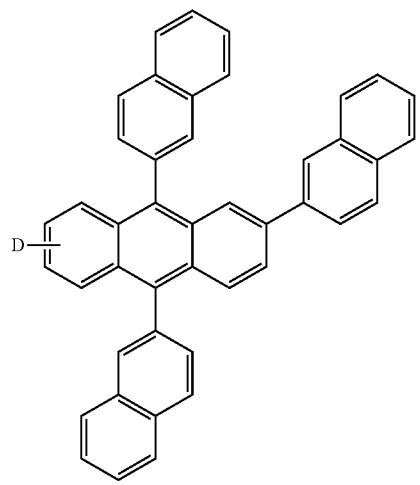
[Formula 3]
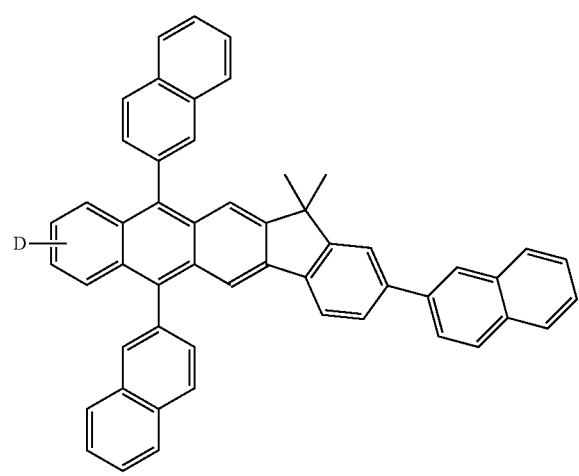
[Formula 4]
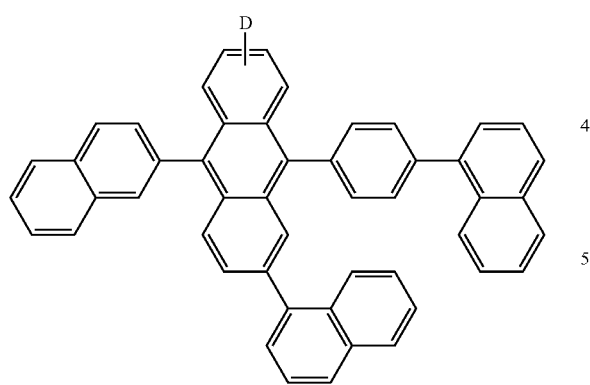
[Formula 5]
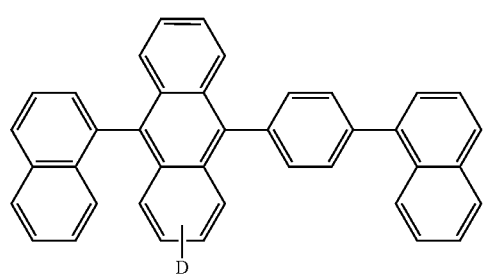
[Formula 6]
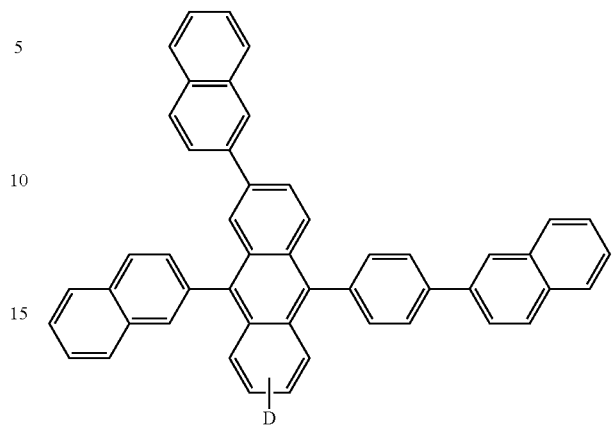
[Formula 7]
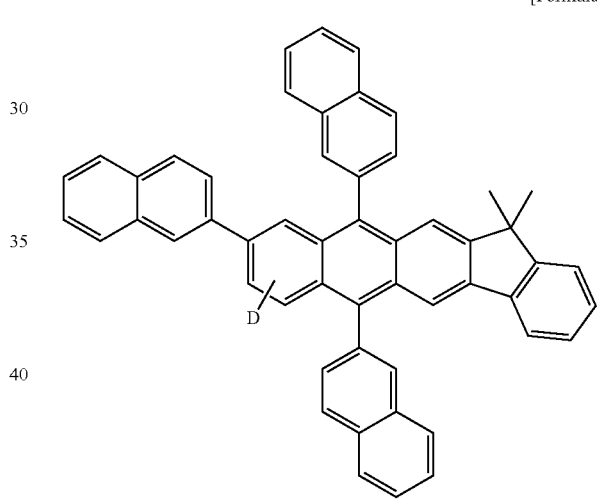
[Formula 8]
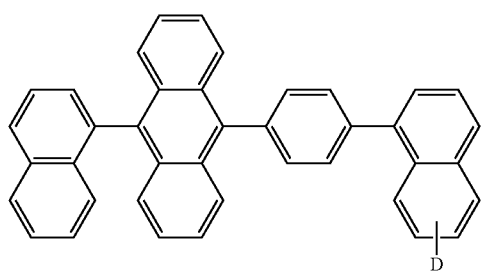

[Formula 9]

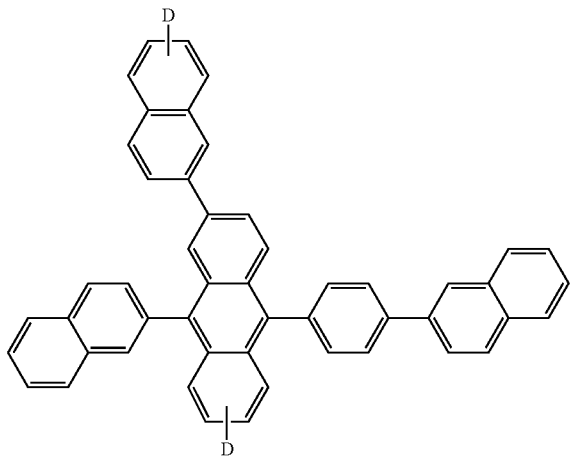

[Formula 10]

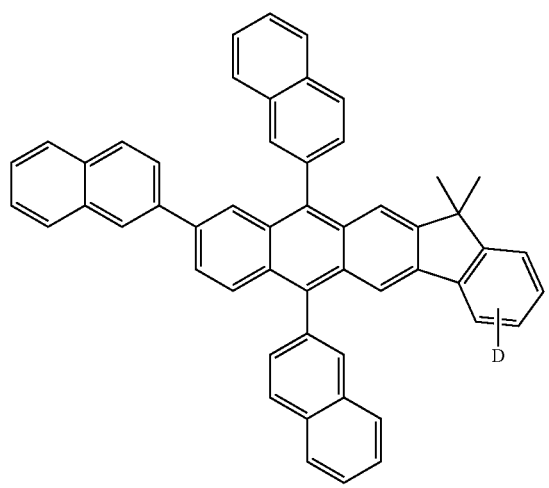

[Formula 11]

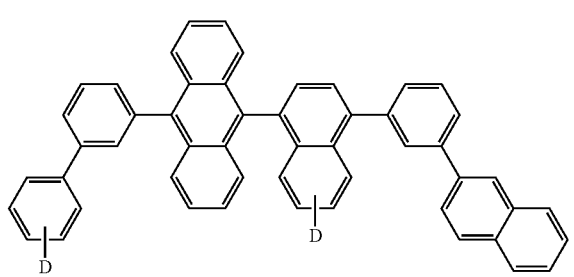

[Formula 12]

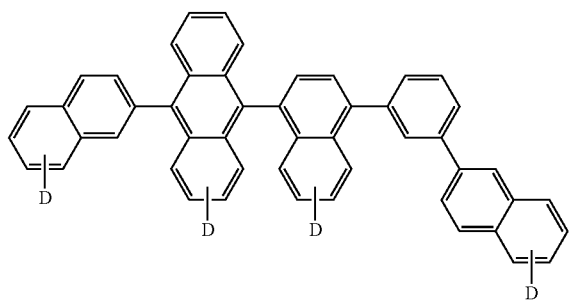

[Formula 13]

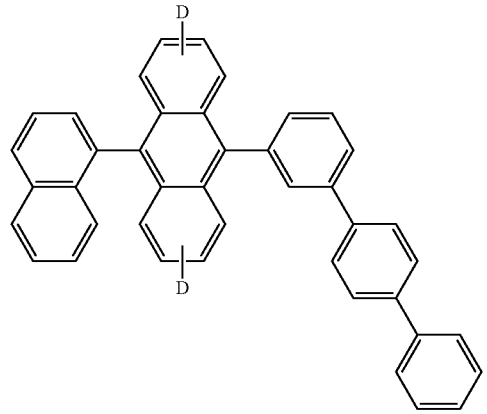

[Formula 14]

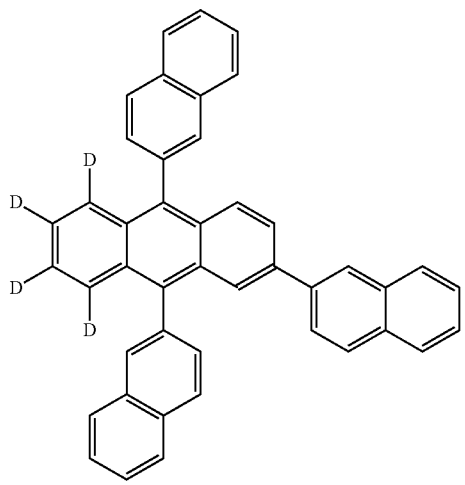

wherein, D is deuterium.

2. The organic material of claim 1, further comprising a dopant material.

3. The organic material of claim 2, wherein the dopant material comprises a substituted or unsubstituted styrene, a substituted or unsubstituted perylene, a substituted or unsubstituted pyrene, a substituted or unsubstituted arylethylbenzene, a substituted or unsubstituted paraphenylene, a substituted or unsubstituted thiophene, a chelate metal complex, or combinations thereof.

4. The organic material of claim 2, wherein the dopant material is further substituted with one or more deuterium atoms.

5. The organic material of claim 4, wherein the dopant material comprises an anthracene derivative further substituted with one or more deuterium atoms.

6. The organic material of claim 2, wherein the dopant material comprises at least one selected from compounds represented by Formula 15 to Formula 23

[Formula 15]
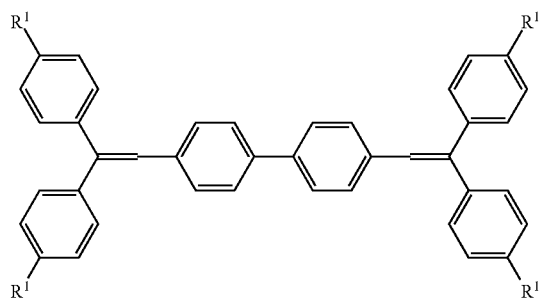
[Formula 16]
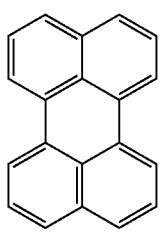
[Formula 17]
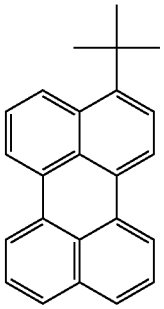
[Formula 18]
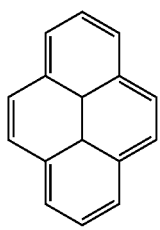
[Formula 19]
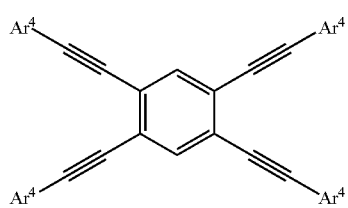
[Formula 20]
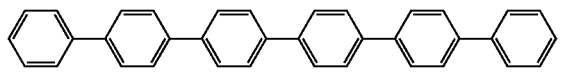
[Formula 21]
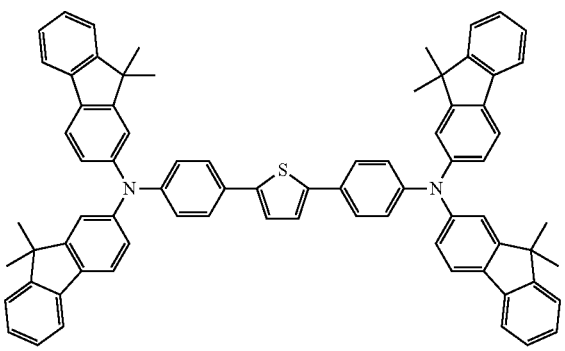
[Formula 22]
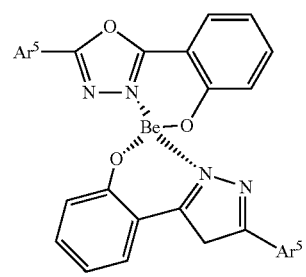
[Formula 23]
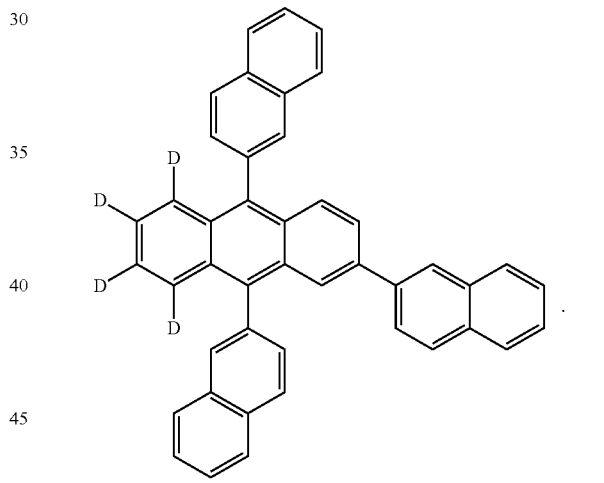
7. The organic material of claim 2, wherein the dopant material comprises at least one selected from compounds represented by Formula 16 and Formula 23.
[Formula 16]
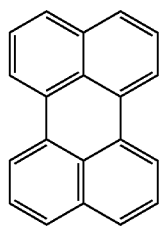

[Formula 23]
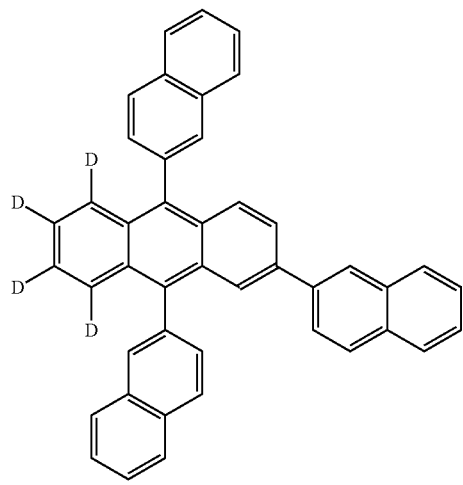
8. An organic light emitting diode display comprising an anthracene derivative is selected from compounds represented by Formula 2, Formula 3, Formula 4, Formula 6, Formula 7, Formula 9, Formula 10 or Formula 14:
[Formula 2]
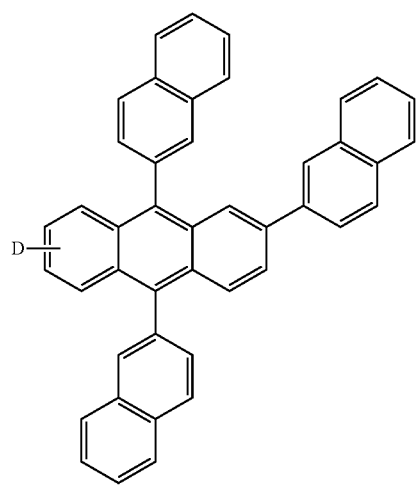
[Formula 3]
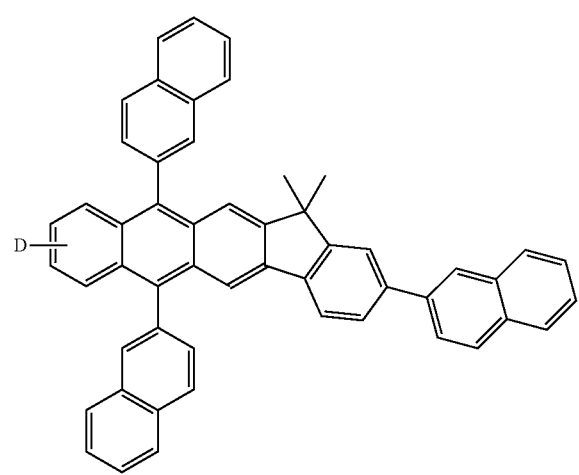
[Formula 4]
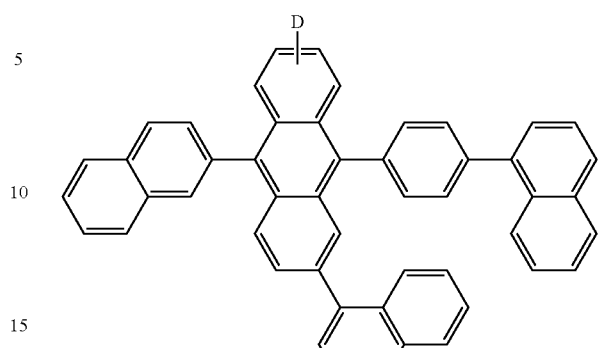
[Formula 5]
[Formula 6]
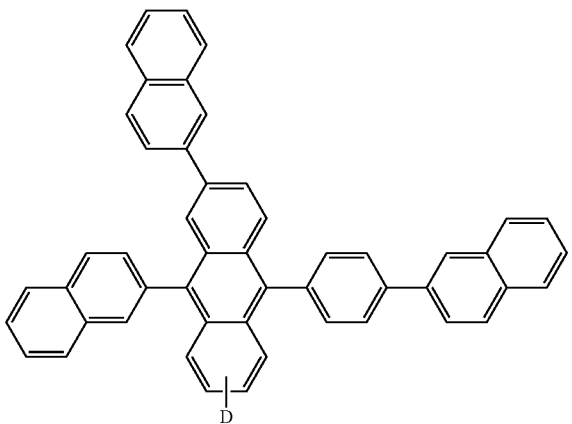
[Formula 7]
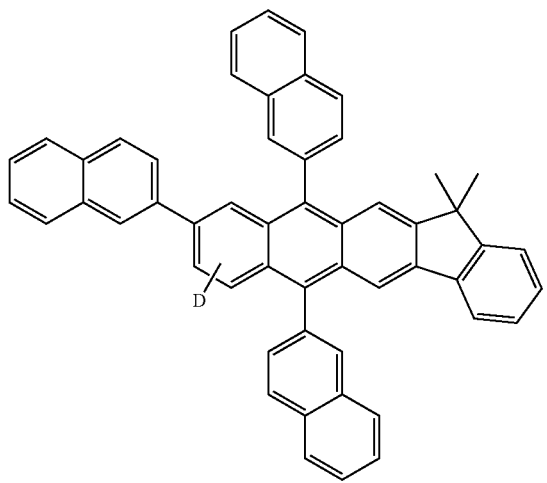

[Formula 8]

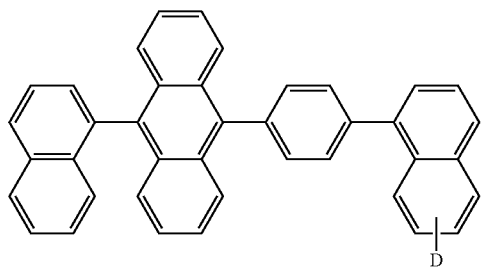

[Formula 9]

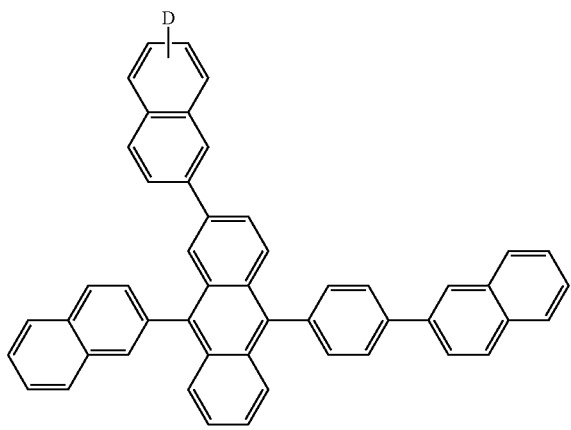

[Formula 10]

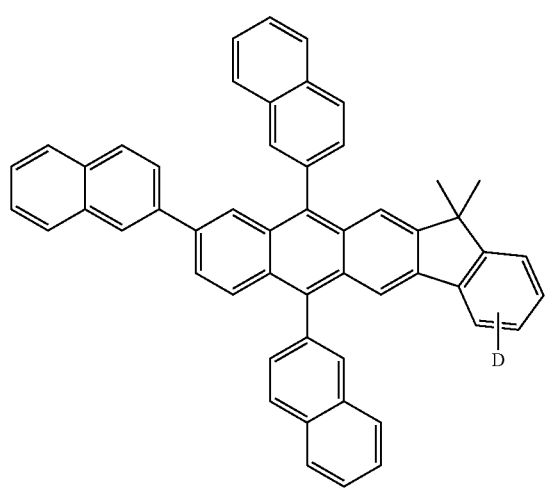

[Formula 11]

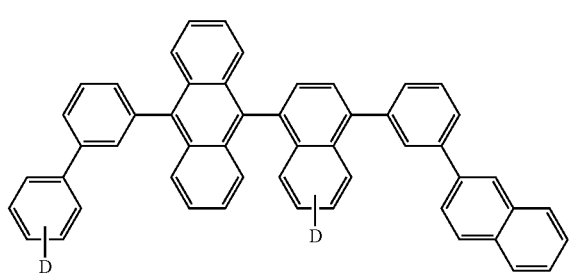

[Formula 12]

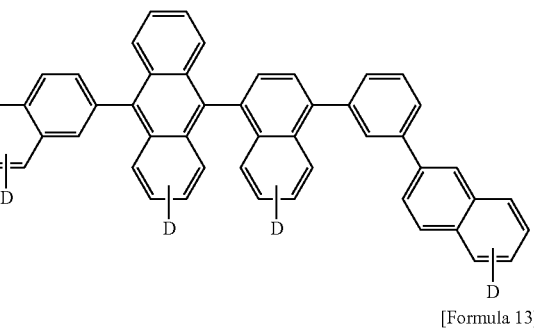

[Formula 13]

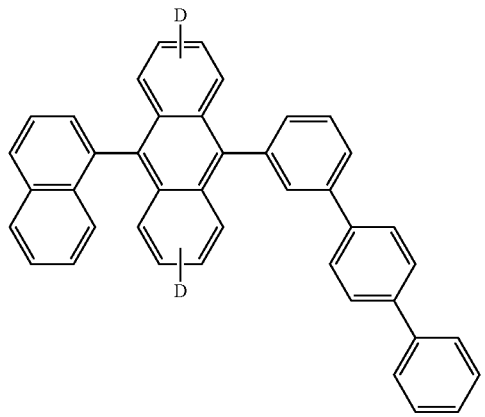

[Formula 14]

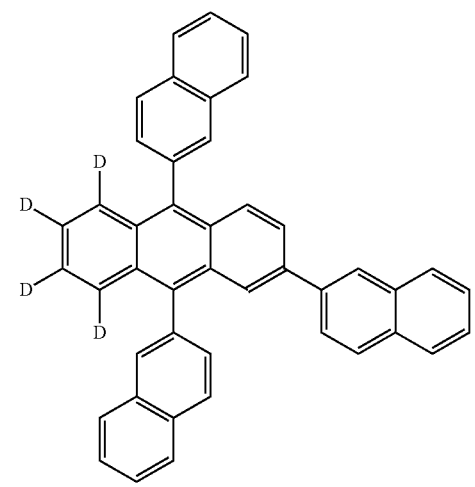

wherein, D is deuterium.

9. The organic light emitting diode display of claim 8, wherein the organic layer is an organic emission layer.

10. The organic light emitting diode display of claim 9, wherein the organic light emission layer further comprises a dopant material.

11. The organic light emitting diode display of claim 10, wherein the dopant material comprises a substituted or unsubstituted styrene, a substituted or unsubstituted perylene, a substituted or unsubstituted pyrene, a substituted or unsubstituted arylethylbenzene, a substituted or unsubstituted paraphenylene, a substituted or unsubstituted thiophene, a chelate metal complex, or combinations thereof.

12. The organic light emitting diode display of claim 10, wherein the dopant material is further substituted with one or more deuterium atoms.

13. The organic light emitting diode display of claim 10, wherein the dopant material comprises an anthracene derivative is further substituted with one or more deuterium atoms.

14. The organic light emitting diode display of claim 10, wherein the dopant material comprises at least one selected from compounds represented by Formula 15 to Formula 23.

[Formula 15]

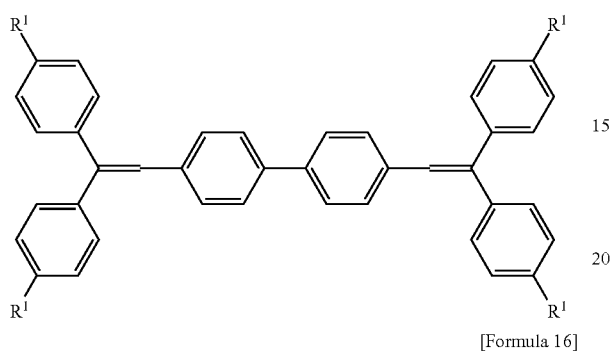

[Formula 16]

[Formula 17]

[Formula 18]

[Formula 19]

[Formula 20]

[Formula 21]

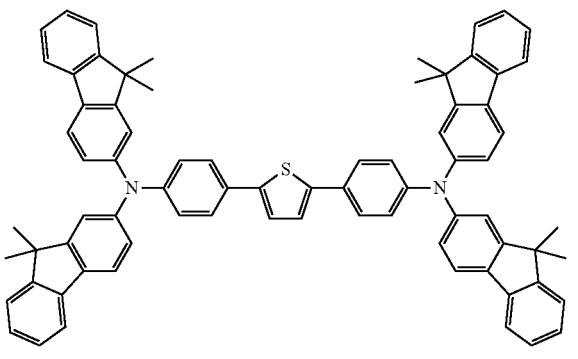

[Formula 22]

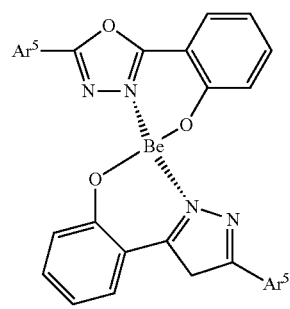

[Formula 23]

[Formula 15]

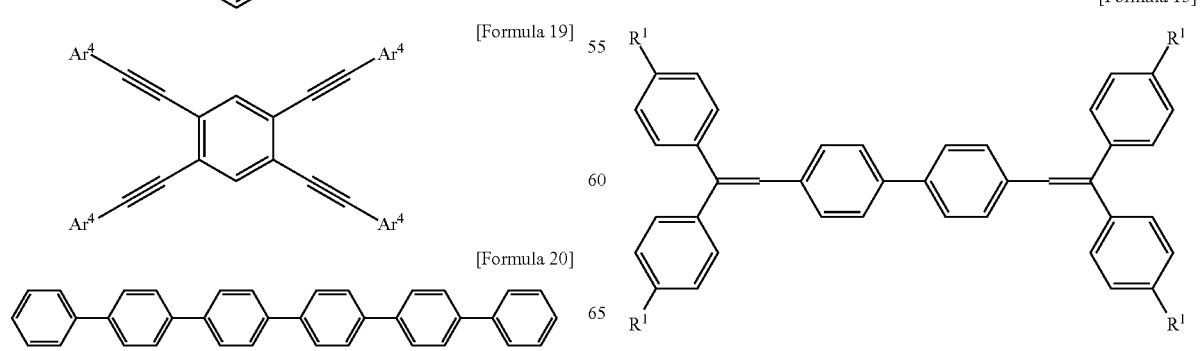

US 9,634,254 B2
33
-continued
[Formula 16]
[Formula 17]
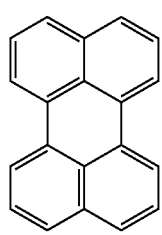
[Formula 18]
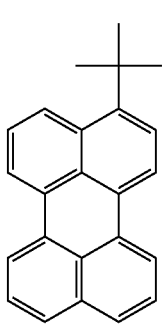
[Formula 19]
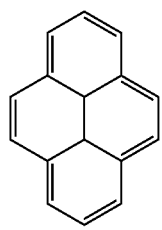
[Formula 20]
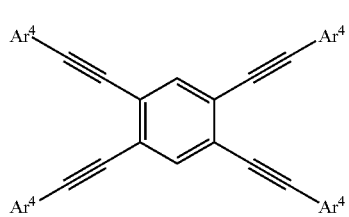
[Formula 21]
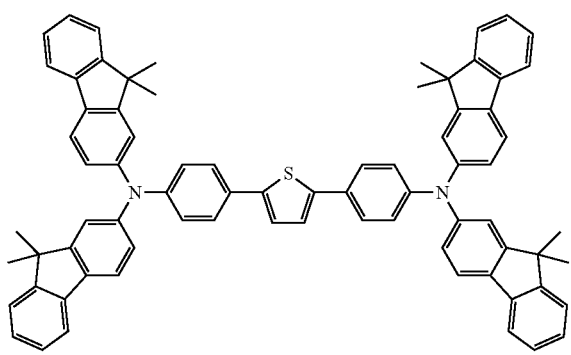
34
-continued
[Formula 22]
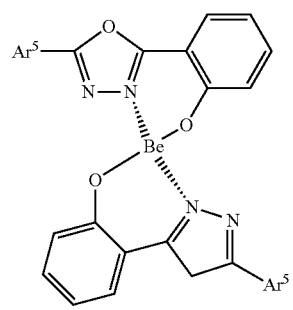
[Formula 23]
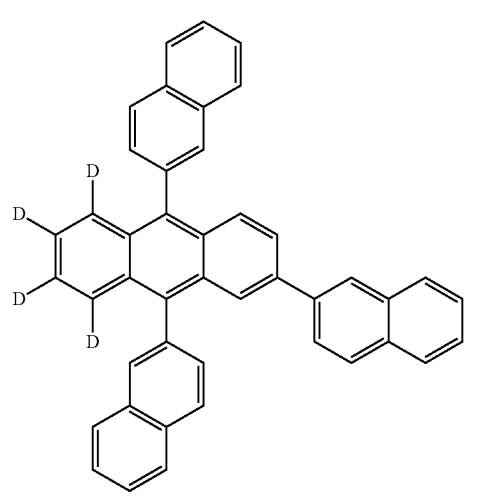
[Formula 15]
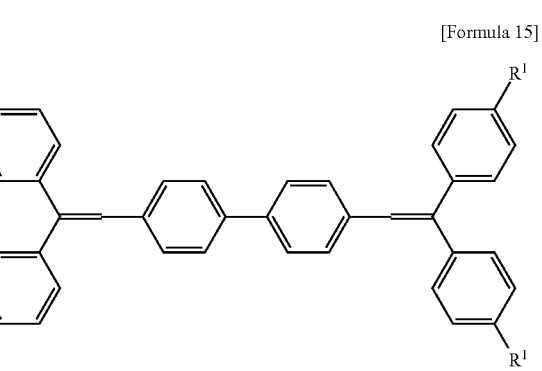
[Formula 16]

[Formula 17]
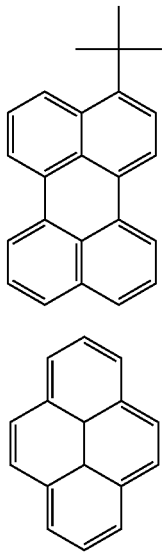
[Formula 18]
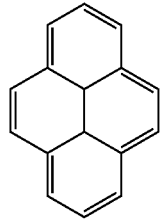
[Formula 19]
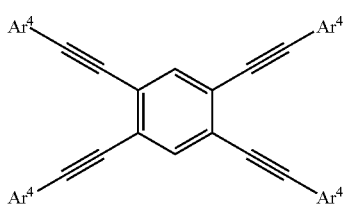
[Formula 20]
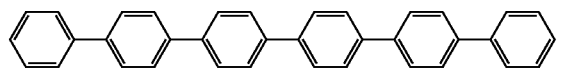
[Formula 21]
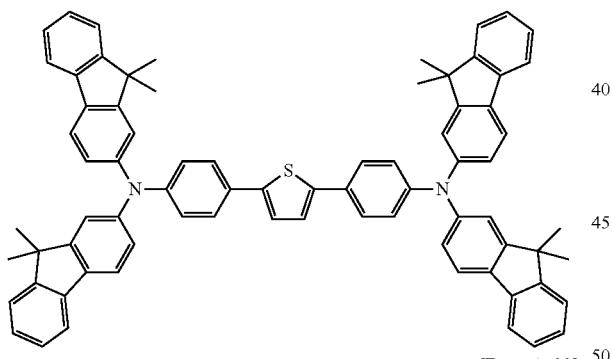
[Formula 22]
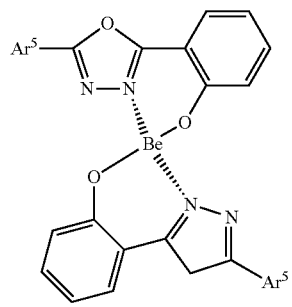
[Formula 23]
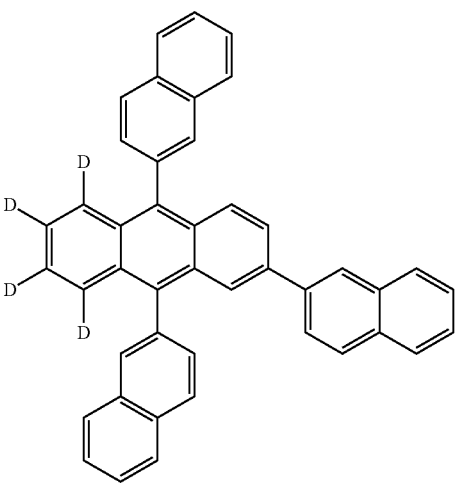
15. The organic light emitting diode display of claim 10, wherein the dopant material comprises at least one selected from compounds represented by Formula 16 and Formula 23.
[Formula 16]
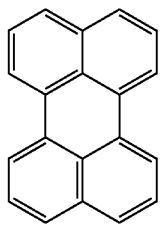
[Formula 23]
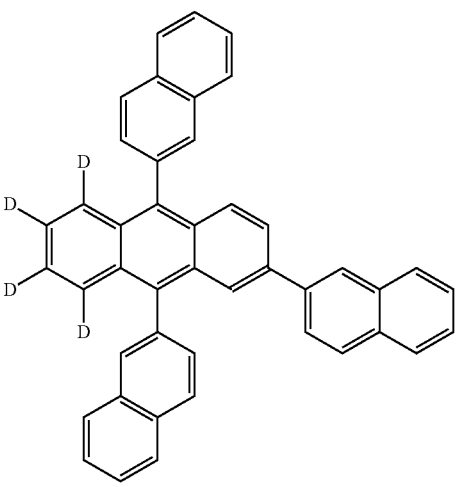
* * * * *